United States Patent
Muecke et al.

(10) Patent No.: US 7,479,837 B2
(45) Date of Patent: Jan. 20, 2009

(54) NOISE SIGNAL GENERATION BY MAPPING RANDOM WORDS

(75) Inventors: Martin Muecke, Stuttgart (DE); Joachim Moll, Herrenberg (DE); Marcus Mueller, Stuttgart (DE)

(73) Assignee: Agilent Technologies, Inc., Santa Clara, CA (US)

( * ) Notice: Subject to any disclaimer, the term of this patent is extended or adjusted under 35 U.S.C. 154(b) by 122 days.

(21) Appl. No.: 11/395,384

(22) Filed: Mar. 31, 2006

(65) Prior Publication Data

US 2007/0024384 A1    Feb. 1, 2007

(30) Foreign Application Priority Data

Jul. 27, 2005   (EP)   ................................ 05106919

(51) Int. Cl.
   *H03B 29/00*   (2006.01)
   *G06F 7/58*    (2006.01)
(52) U.S. Cl. ..................... 331/78; 708/250; 708/252
(58) Field of Classification Search ................ 331/78; 708/250, 252
   See application file for complete search history.

(56) References Cited

U.S. PATENT DOCUMENTS

| | | | |
|---|---|---|---|
| 4,173,000 A * | 10/1979 | Singer et al. | ........... 331/78 |
| 4,296,384 A | 10/1981 | Mishima | |
| 4,516,217 A | 5/1985 | Starner | |
| 5,696,828 A * | 12/1997 | Koopman, Jr. | ............ 380/46 |
| 6,516,025 B1 * | 2/2003 | Warke et al. | ............ 375/222 |
| 6,691,141 B2 * | 2/2004 | Schmidt | ............ 708/250 |
| 6,732,128 B2 * | 5/2004 | Kelly | ............ 708/270 |
| 6,756,854 B2 * | 6/2004 | Stoddard et al. | ............ 331/78 |
| 2004/0095167 A1 | 5/2004 | Schneider et al. | |

FOREIGN PATENT DOCUMENTS

WO    WO 03/039046 A1    8/2003

OTHER PUBLICATIONS

Page, et al., A FPGA ASIC Communication Channel Systems Emulator, Proceedings Sixth Annual IEEE International ASIC Conference and Exhibit, New York, NY, 1993, pp. 345-348.
EP Search Report dated Dec. 22, 2005.

* cited by examiner

*Primary Examiner*—Robert Pascal
*Assistant Examiner*—Levi Gannon
(74) *Attorney, Agent, or Firm*—Marc Bobys

(57) ABSTRACT

A noise signal generator includes a random word generator for generating a sequence of random words, each word representing an input value, a mapping unit for receiving the sequence of random words, mapping each input value to an output value of according to a probability distribution function, and providing a corresponding sequence of output values, and a digital-to-analog converter for generating a noise signal based on the output values.

10 Claims, 4 Drawing Sheets

NOISE SIGNAL GENERATION BY MAPPING RANDOM WORDS

BACKGROUND

The present invention relates to noise signal generation.

The generation of a signal and more specifically a noise signal is recently becoming more and more important for different kinds of test and measurement aspects when designing and developing integrated circuitry. Thereby, noise can be defined as a spontaneous and time-independent variation of signals.

Also noise like signals based on pseudo-noise sequences are regarded as noise signals. A pseudo noise sequence is a sequence of digital values generated by a feedback shift register. Dependent on the length of the shift register a repetitive pattern is generated. Pseudo noise patterns are easy to generate and therefore are often used e.g. for test purposes.

Further kinds of signals, e.g. WCDMA signals, having similar characteristics compared to noise signals as described above are regarded as noise signals within the scope of the present invention.

SUMMARY

It is an object of the present invention to provide an improved noise signal generation. The object is solved by the independent claims. Further embodiments are shown by the dependent claims.

According to an embodiment of the present invention a noise signal generator comprises a random word generator for generating a sequence of random or pseudo-random words, each word representing an input value out of a first set of values, a mapping unit for receiving the sequence of random words, mapping each input value of the first set of values to an output value of an second set of values according to a probability distribution function and providing a corresponding sequence of output values, and a digital-to-analog converter for generating a noise signal based on the output values, wherein a distribution of output values corresponds to the probability distribution function, or in other words, the derivation of the probability distribution function or the inverse to the probability distribution function (depending on how the mapping is regarded) is substantially similar to the output value distribution.

In an embodiment, the random word sequences are pseudo-random word sequences, also known as PRWS sequences. The PRWS sequences might be composed of a plurality of a digital pseudo-random bit sequences, also known as PRBS sequences, showing an equal distribution of "0" and "1".

In a further embodiment, the noise signal generator comprises a memory adapted for storing values representing a probability distribution of a signal pattern. In other words, the memory does not store the signal pattern itself, but a noise pattern distribution.

By storing a noise pattern distribution instead of storing the total noise pattern within a memory, the memory size can be chosen to be significantly smaller compared to a memory necessary to store the total noise pattern. The length of the noise pattern to be generated is only dependent on the length of the random word of the random generator. Since the memory is addressed in a random fashion, the level of the output signal is also random. This allows for generating long period noise patterns without any limitations due to limited memory space e.g. available in an arbitrary waveform generator.

Further, noise parameters can be chosen to be flexible, and a change of a parameter can be carried out by simply changing the distribution function. Therefore, different distribution functions can be stored in the memory.

In a further embodiment, the distribution function stored represents an integral level signal pattern distribution of the corresponding noise to be generated. The integral level distribution of a noise pattern represents the integrated probability of the noise level (i.e. the output value between a minimum and a maximum value of the second set of values) within the signal pattern.

In a further embodiment, the pattern generator comprises further a random word generator adapted for generating a random word comprising a length of n bits. The memory is coupled to the random word generator and is being adapted to output a stored value addressed by the random word. Hence the random word is used as an address word for addressing the memory and reading a stored value. By addressing the memory dependent on the random word generated by the random word generator, stored values are output representing a noise pattern according to the desired signal pattern distribution.

In an embodiment of the invention, the memory adapted for storing amplitude values comprises a programming interface adapted for programming values representing a level distribution of a signal pattern within the memory. This permits storing of different signal patterns within the memory and, for example, selecting one level distribution out of the plurality of distributions of different signal patterns.

As a non-limiting example in one embodiment of the invention, the stored values within the memory represent a Gaussian noise pattern distribution. This distribution can be described using the sigma value of the distribution. As the peak-peak value usually is fixed (Output range of the DAC), with the sigma (or rms) value the crest factor of the generated noise can be adjusted. Other possible distributions are Poisson distribution or a custom distribution.

In a further embodiment of the invention, the stored values represent a signal pattern according to a test signal of the UMTS or WCDMA specification. In a further embodiment of the invention, the stored values represent a level distribution of a signal according to a test signal of the 802.11a specification. It is understood, the different signal pattern distributions can be stored In a further embodiment of the invention, the programming interface of the memory comprises means for setting a crest factor of the level distribution for the values to be stored within the memory. In another embodiment, the pattern generator comprises means for setting an rms-value of the level distribution of the signal pattern for the values to be stored in the memory.

In a further embodiment of the invention, the random word generator comprises a plurality of linear feedback shift registers. The generator is adapted to generate pseudo random word sequences. Those registers can be adapted as PRBS generators in one embodiment of the invention. The output of the linear feedback shift registers are fed into a multiplexer, adapted for generating a word comprising the length of n bits.

In some cases, only a few values represent the peak values of the level distribution of the signal pattern. Most values stored in the memory are in the same magnitude at the center of the amplitude distribution. In other words, many values are the same or have only small difference from each other. In an embodiment of the invention, a smaller memory is used, wherein not every value is stored. In an embodiment of the invention, an address-mapping unit between the output of the random word sequence generator and the memory is provided. The address-mapping unit is adapted for generating a second word out of the random word delivered by the random word generator. The second word is having the length of o bits and is generated by mapping m bits of the random word onto p bits of the second word. Hence, the random word generated by the random word generator is mapped onto a second word, which is used for addressing the stored values within the memory.

In a further embodiment, the memory comprises a plurality of logical memory blocks, each block having a length of k bits and adapted for storing one of the values representing the amplitude pattern distribution. Each block is being addressable by the random word. In a further embodiment, at least one memory block is addressable by more than one random word generated by the random word sequence generator. This will reduce the memory size needed compared to a memory adapted for storing each value of the noise pattern distribution.

Instead of calculating the total signal pattern and storing the signal pattern within the memory, values representing the level distribution of the signal are stored in a memory. Then, a random signal determining a memory address of the memory is generated. In a further step, at least one value is read out of the memory dependent on the random signal. In an additional embodiment, areas of the level distribution of the pattern are identified in which the level values themselves comprise only a small variation. These values or areas, respectively, are combined into one value. In addition, the memory addresses assigned to the values are now mapped onto one address. This permits to save additional memory size. The random signal, preferably generated by a pseudo-random word sequence generator, might comprise a length of n bits while the memory can only address m different samples. In areas where the deviation of the values representing the level distribution is quite small, the same values will be read out.

Embodiments of the invention can be partly or entirely embodied or supported by one or more suitable software programs. The programs can be stored on or otherwise provided by any kind of data carrier which might be executed in or by any suitable data processing unit.

BRIEF DESCRIPTION OF DRAWINGS

Other objects and many attendant advantages of the embodiments of the present invention will be readily appreciated and become better understood by reference to the following more detailed description of the embodiments in connection with the accompanying drawings. Features that are substantially or functionally equal or similar will be referred to by the same reference signs.

DETAILED DESCRIPTION

Figure 1:
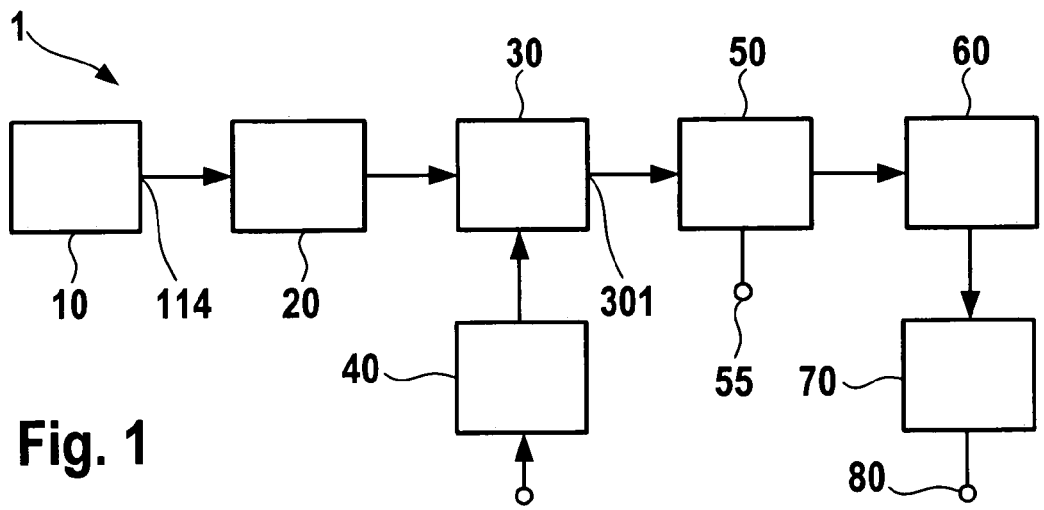
FIG. 1 shows a first embodiment of a pattern generator according to the present invention.

Analog noise generation requires much effort to get results, especially when the noise generation is defined by addition noise characteristics such as peak-to-peak voltage, RMS noise, and crest factor. Therefore, a fully digital approach for noise generation is proposed. Basically, a noise pattern generator 1 according to an embodiment of the present invention comprises a pseudo-random word sequence generator 10 connected with its output terminal 114 to a compression unit or address-mapping unit 20. The pseudo-random word generated by the pseudo-random word sequence generator 10 is basically taken as an address to address a memory block within a memory 30.

The memory block within the memory 30 stores a value representing a level. These values can also referred to as samples. The plurality of all values stored within the memory 30 represents a level probability distribution of a signal pattern. The memory 30 connected with its input to the output of the address-mapping unit 20 stores values, each value having the length of k bits and the collectivity of values representing a desired pattern distribution. For example, the memory may store $2^{25}$ values, each value having a length of 16 Bits, resulting in a total memory size of approximately 66 MByte. An output 301 of the memory 30 is connected to a digital filter 50 controlling the bandwidth of the noise signal. The output of this optional filter 50 is passed to a digital/analog converter 60 with k-Bit resolution for providing an analog output signal. The analog output signal is fed into a reconstruction filter 70 optimizing the output characteristics of the noise. Finally, the sample is output at terminal 80 as an analog voltage signal.

The noise pattern generator generates a new value with each clock signal of the reference clock on its output 301. With each clock, the pseudo-random word sequence generator 10 outputs a word, representing an address for addressing a block within the memory, in which a value or a sample respectively is stored. The different addresses or lock-up vectors, respectively, generated by the generator 10 yields in a desired digital noise wave form according to the stored level distribution on the output 301 of the memory 30.

Figure 5A:
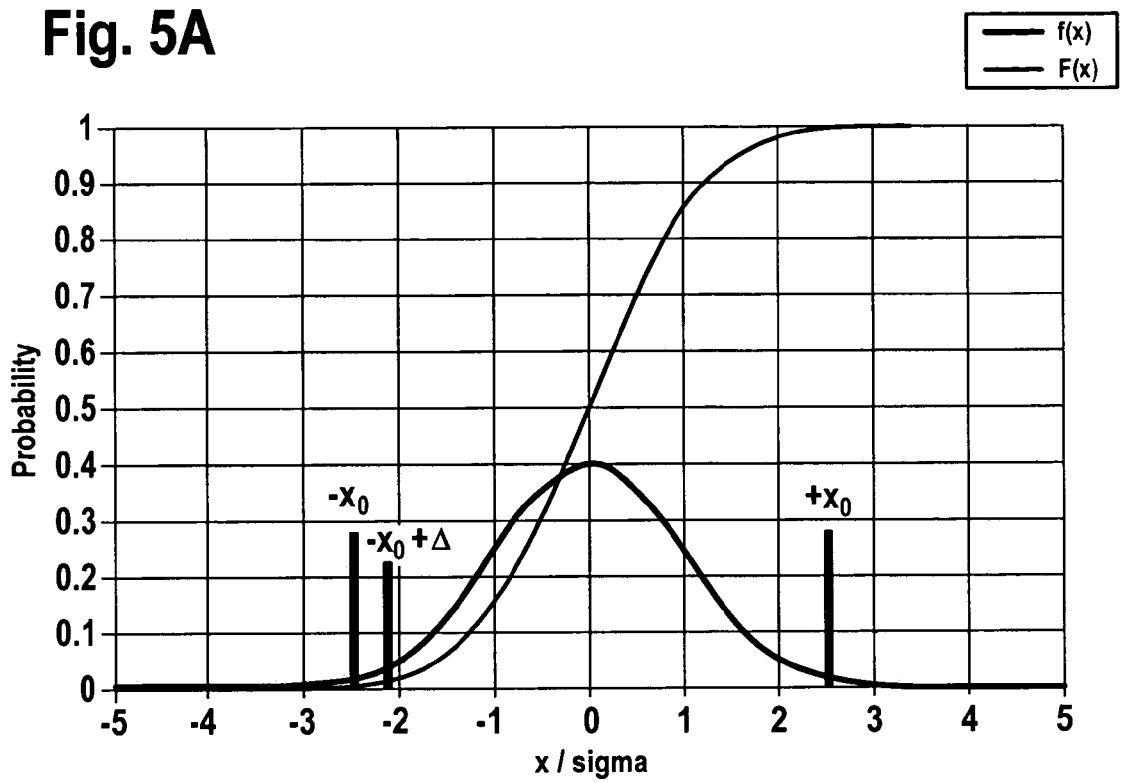
FIG. 5A and FIG. 5B show a probability function of a Gaussian distribution and the corresponding amplitude values within the memory address space.
Figure 5B:
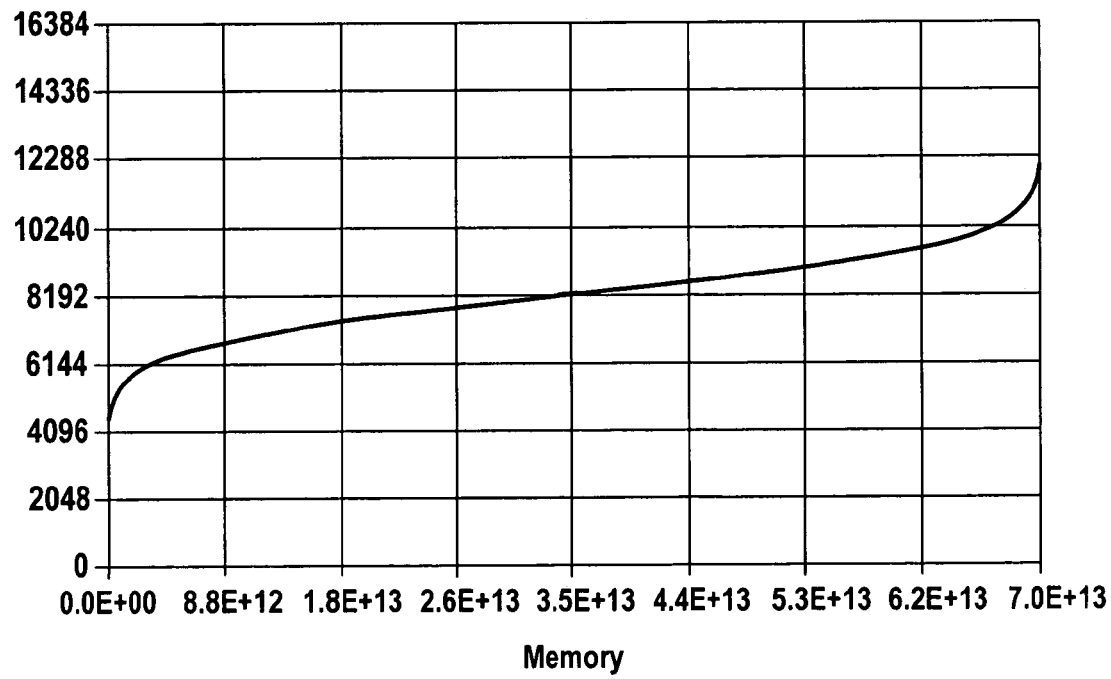

A non limiting example of values within the memory, representing a Gaussian distribution function can be seen in FIG. 5A. The diagram shows the probability function f(x) of a Gaussian distribution, mainly in the interval of $[-x_0, +x_0]$ and the corresponding error function F(x). As one can see, the probabilities of small levels in the range of $x=x_0$ or high levels in the range of $x=x_0$ are very low. On the other hand, the probability of levels around the value x=0 is quite high. FIG. 5b shows the amplitude values dependent on the memory addresses of the memory. The memory address range in this non-limiting example from 0 to $7*10^{13}$ is equivalent to equally distributed steps from a probability p to 1–p. The normalized level is distributed according to the inverse of the normal cumulative distribution function. For a Gaussian level distribution as seen in FIG. 5A the memory contains the following content:

$$Mem(x) = \left(\sigma_0 + F^{-1}\left(P_{bin0} + (1 - P_{bin0})\frac{x}{2^k}\right)\right)\frac{2^d}{2\sigma_0}$$

with x as the memory address, x as a function of the desired Crestfactor (see FIG. 5a) $x_0$=s/Crestfactor, $P_{bin0}$ the minimum probability of bin 0 (see below), f(x) being the standard normal cumulative distribution, F(x) the standard error function, k the width of the memory in bit and d the resolution of the DAC in Bit.

Typically a DAC is limited to 10-18 Bit, and a typical memory width is 18 to 32 Bit. Of course, other values for the memory size and the DAC resolution are also possible. Obviously the memory can store a multiple of possible DAC values.

To calculate the memory data from the Gaussian probability distribution we divide the range between the limits $-x_0$ and $+x_0$ in $2^n$ bins of the width $\Delta$.

$$\Delta = \frac{2x_0}{2^n \text{ sigma}}$$

With a Gaussian distribution we get a probability of $$P_{bin0} = \frac{F(-x_0 + \Delta) - F(-x_0)}{F(x_0) - F(-x_0)}$$

for the first bin. To get one sample in this bin we need $1/P_{bin0}$ samples. Table 1 shows some values for $P_{bin0}$, minimum sample number and memory size.

referred to as "multiple return shift register generators" or "modular shift register generators". Between different shift registers 110 and 110*a*, for example, an XOR gate 111 is provided.

The output of the m pseudo-random bit sequence generators 100 are fed into a multiplexer unit 113 whose output is connected to the output terminal 114. The multiplexer unit 113 is adapted for generating a word consisting of the output bits of the PRBS generators 100.

Each of the PRBS generators 100 comprises an input terminal 118 for providing different start values to the PRBS generators 100. This is necessary, because the linear shift registers will always output the same value, if the structure of the linear feedback shift registers are equal and they are provided with the same starting values.

It is known to a person skilled in the art that the PRWS generators 10 and the PRBS generators thereof might include different linear feedback shift registers. The different structure, for example XOR-gates on different positions between the shift registers 110, 110*a* to 110*z* result in different output values, even the registers are initiated with the same start values. Table 2 shows the duration of such a PRWS using a 600 MSample/s system. With long PRWS Sequences the length of the generated pattern is virtually unlimited.

TABLE 1

Number of bins and memory size

| Bins $2^n$ | 8 | 8 | 8 | 8 | 10 |
|---|---|---|---|---|---|
| $x_0$ | 4 | 5 | 6 | 7 | 6 |
| $P_{pp}$ | 0.999936628 | 0.999999426 | 0.999999998 | 1-2.6E−12 | 0.999999998 |
| $P_{bin0}$ | 4.45536E−06 | 6.41978E−08 | 3.29791E−10 | 6.11955E−13 | 7.39966E−11 |
| #samples | 224448 | 15576860 | 3032227776 | 1.63411E+12 | 13514136873 |
| lb #samples (Address bus width in Bit) | 18 | 24 | 31 | 41 | 34 |
| crest factor | 8 | 10 | 12 | 14 | 12 |

As one can see, very wide address buses and a huge number of samples are necessary to achieve high crest factors, wherein the crest factor is defined as the peak-to-peak-rms (sigma) ratio.

Figure 6:
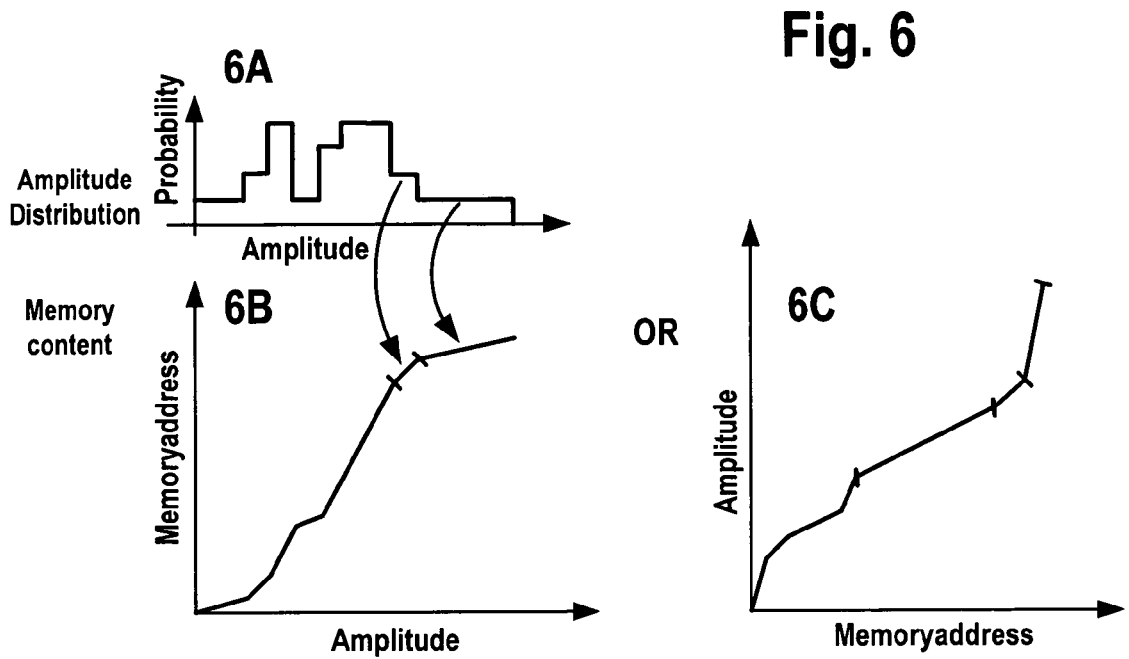
FIG. 6 shows a probability function of different amplitude distribution and the corresponding memory content.

A second example including a different probability function of an amplitude distribution is shown in FIG. 6. As one can see, the probability distribution of this signal pattern is completely different from the Gaussian distribution in FIG. 5. Nevertheless, the distribution can be stored in the memory. In this case, the distribution in the memory corresponds to the integral of the level distribution. One can see that the deviation of the level distribution in dependence to the memory address according to FIG. 6C corresponds to the probability of the amplitude in FIG. 6A.

Figure 2:
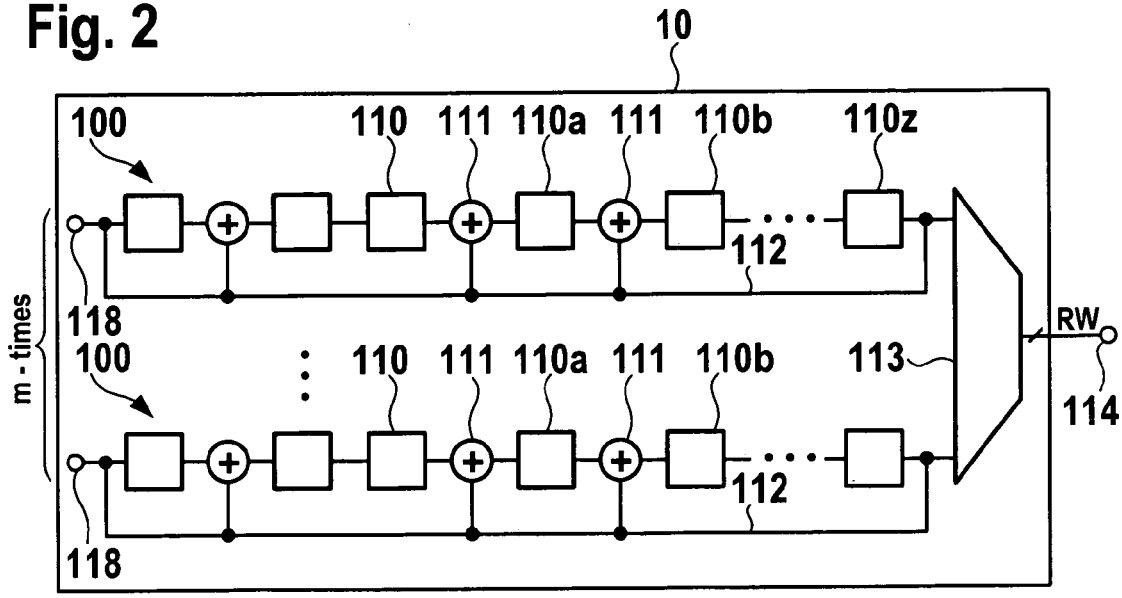
FIG. 2 shows a first embodiment of a pseudo-random word sequence generator.

FIG. 2 shows a first embodiment of a pseudo-random word sequence generator (PRWS generator), which can be used in an embodiment of the present invention. The PRWS generator comprises a plurality of pseudo-random bit sequence generators 100 (PRBS-generators). Each of the PRBS-generators comprises a linear feedback shift register 100 as shown in FIG. 2. The register 100 includes a plurality of shift registers 110, 110*a*, 110*b*, . . . , 110*z* connected in series. The feedback path 112 is provided connecting the output of the last register 110*z* to the first register of the PRWS generator. The linear feedback shift registers 100 as shown in FIG. 2 are also

TABLE 2

Duration of PRWS sequences at 600 MSamples/s

| Polynomial | Duration |
|---|---|
| 2^15-1 | 55 μs |
| 2^24-1 | 28 ms |
| 2^31-1 | 3.5 s |
| 2^39-1 | 15 min |
| 2^47-1 | 2.7 d |
| 2^63-1 | 487 y |

Figure 3:
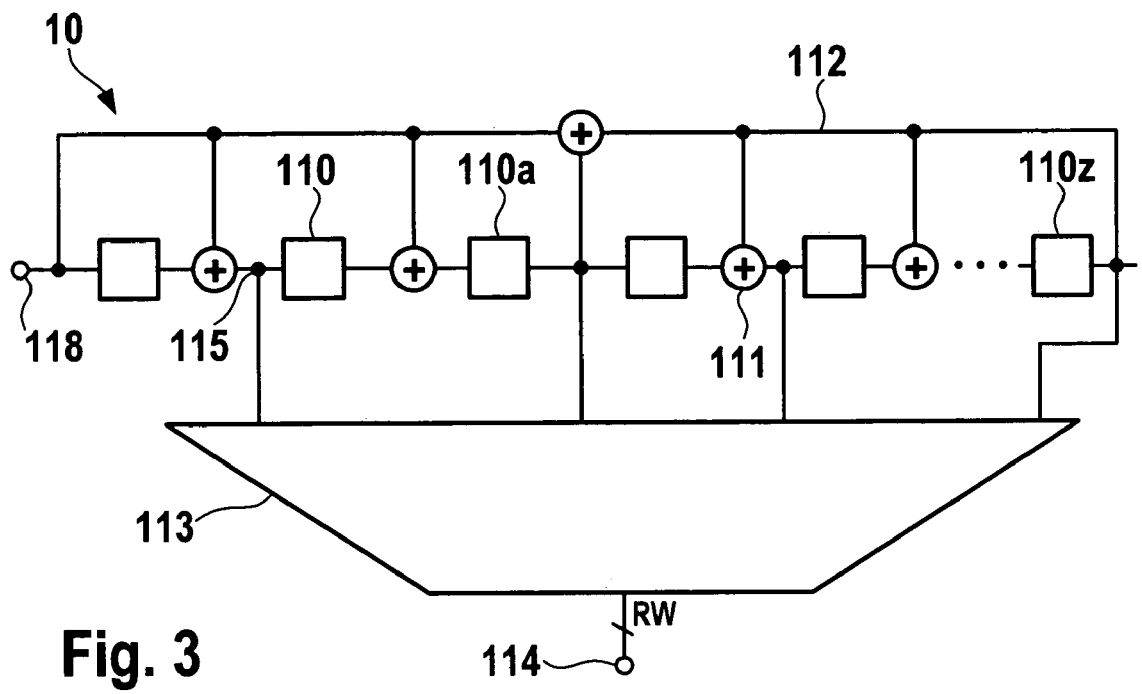
FIG. 3 shows a second embodiment of a pseudo-random word sequence generator.

A different embodiment of a pseudo-random word sequence generator is shown in FIG. 3. The generator comprises shift registers with different feedback paths as seen in FIG. 3. In addition, terminal points 115 are provided on which the output signals are fed into in multiplexer unit 113. For generating a pseudo-random word sequence having the length of m bits, one needs at least m terminal points 115. Again, the linear feedback shift registers are initiated with a starting value on the input terminal 118.

It might be known to one skilled in the art that it is possible to use a different linear feedback shift register when creating the pseudo-random word sequence. When using the same linear feedback shift registers as shown in FIG. 2, for example, the feedback shift registers have to be initiated by different start values. Otherwise, they will always produce the same output sequence.

Figure 1A:
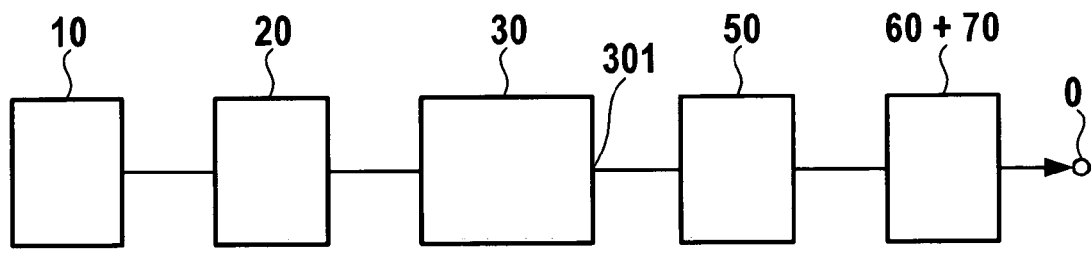
FIG. 1A shows a second embodiment of a pattern generator according to the present invention.

FIG. 1A shows another embodiment of the present invention. Between the output terminal 114 and the memory 30, address-mapping unit 20 is provided. This address-mapping unit is adapted for mapping the pseudo-random sequence word representing an address to a physical address of the memory 30. A mapping of addresses to a smaller address space permits the use of a memory quite smaller than the address range provided by the pseudo random sequence word used as an address.

Figure 4:
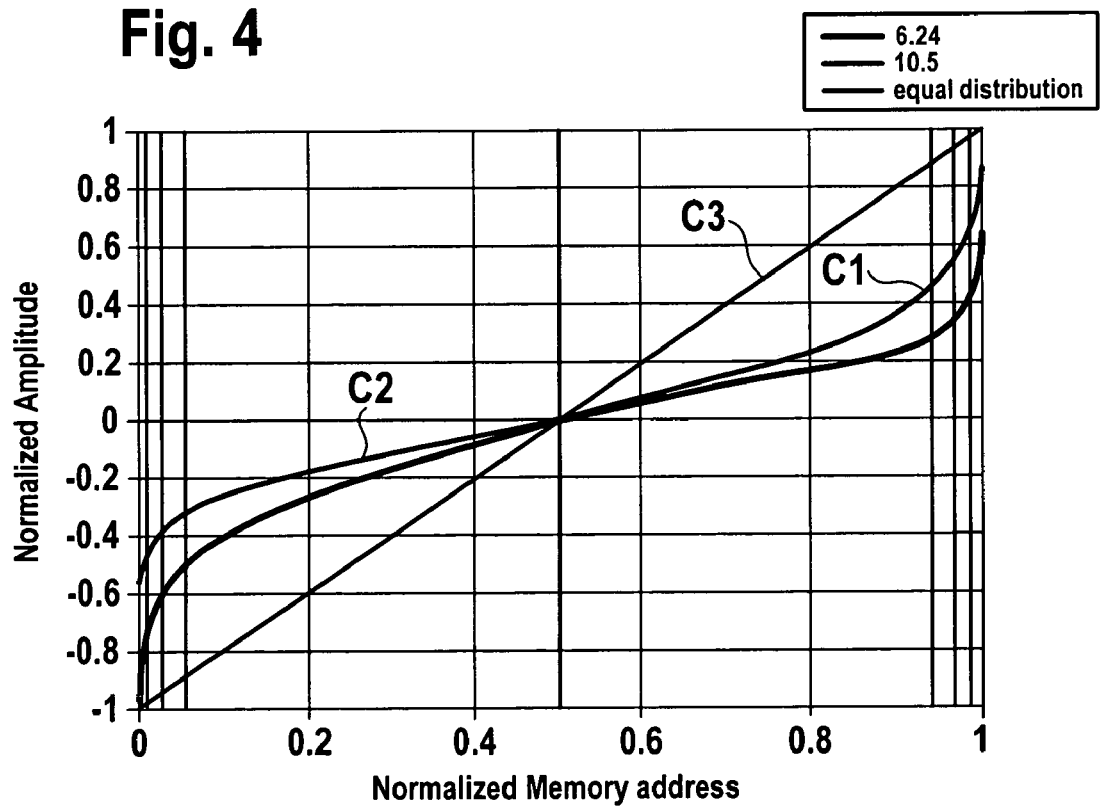
FIG. 4 shows different level distributions within a memory address space according to an embodiment of the invention.

For example, if a Gaussian distribution of the noise is used, only a few values represent the peak noise as can be seen from FIG. 5. Most of the values are in the same magnitude at the center of the distribution. This means that the same value is being addressed by different random words from the PRWS generator 10. FIG. 4 shows different distribution functions of noise having different crest factors. The crest factor of a signal is herewith defined by the difference of the maximum value and the RMS or mean value, respectively. As one can see from FIG. 4 and curve C3, an equal distribution of the amplitude results in a distribution function within the memory space with a constant deviation. In an equal distribution each level value within the distribution has the same probability for occurring over time within the signal.

However, other amplitude distributions are possible. Real signals, for example a WCDMA, EDGE or other signals according to mobile communication standards have different amplitude distribution a shown in FIG. 4. The curve C2 shows a level distribution of a WCDMA test signal having a crest factor of 10.5, the curve C1 represents the level distribution of an EDGE signal.

If the signal comprises a crest factor as seen in the curves C1 and C2, the deviation of the amplitude distribution within the memory address space changes dramatically. As mentioned before, the crest factor is defined by the difference of the maximum amplitude value and the rms- or root mean square value, respectively. A high crest factor means that the difference between the maximum value and the rms-value is quite high, the probability, however, of such high values is quite low. A low probability of an amplitude value results in a value addressable in the memory by only a few addresses. This can be seen in the curves C1 and C2.

In the diagrams of Figure four all amplitude values as well as the address range of the memory is normalized for simplicity. Very high or very low normalized amplitude level values, in the ranges of about ±1 are only stored in a few addresses within the memory, while values representing a normalized amplitude level around 0 occur more often.

Instead of a big memory where every value is used only once, address ranges within the memory having only small differences in their stored values can be condensed to small address ranges giving out their values more than one time. Hence the address range, wherein more than one addresses point to same or similar amplitude values is mapped onto a second address range, wherein one address point to one amplitude value. The principle can be demonstrated in FIG. 5B. One assumes that we have $2^{46}$ different addresses within the calculated memory space, but only $2^{14}$ different DAC values. This means, as one can see in FIG. 5B that many samples in the memory addressed by different addresses are equal or at least differ only slightly (differences are below a defied threshold). Hence, it is possible to map those samples onto one address, thereby reducing the used address space.

This memory mapping can be used to enhance the resolution in critical areas where the deviation of the amplitude distribution function is quite high and to reduce the resolution where the deviation is low.

As the memory is very big and does not contain much information, only $2^{14}$ different entries in $2^{46}$ Addresses we can dramatically reduce the memory size. A possible solution for a reduction of the used memory is seen in the next table.

| Address range MSB 7 Bit | Map to MSB 3 Bit | Factor | Offset |
|---|---|---|---|
| 000 0000 | 000 | 1 | 000 |
| 000 0001 | 001 | 1 | 000 |
| 000 001x | 010 | 2 | 001 |
| 000 01xx | 011 | 4 | 010 |
| 000 1xxx | 100 | 8 | 011 |
| 001 xxxx | 101 | 16 | 100 |
| 01x xxxx | 110 | 32 | 101 |
| 1x xxxxx | 111 | 64 | 110 |

We divide the address vector by the factor given in above table. Then an offset value is added to restore the right order of memory addressing.

The table below shows an example for reducing the address from 7 MSB to 3 MSB. The Origin address of 13 Bit is thereby reduced to 9 Bits. Since the function is symmetric, one can use the utmost MSB to mirror the memory content. If the MSB for example contains "1", one has to mirror the address vector and the resulting memory output. This procedure will save additional memory.

| Address | Shift by | Shifted omit leading 4 zeros LSBs shifted to the right are also omitted | Offset To 3 MSB Bits | New address |
|---|---|---|---|---|
| 0000000abcdef | 0 | 0000000abcdef | 000 | 000abcdef |
| 0000001abcdef | 0 | 0000001abcdef | 000 | 001abcdef |
| 0000010abcdef | 1 | 00000010abcde | 001 | 0100abcde |
| 0000011abcdef | 1 | 00000011abcde | 001 | 0101abcde |
| 0000100abcdef | 2 | 000000100abcd | 010 | 01100abcd |
| 0000101abcdef | 2 | 000000101abcd | 010 | 01101abcd |
| 0000110abcdef | 2 | 000000110abcd | 010 | 01110abcd |
| 0000111abcdef | 2 | 000000111abcd | 010 | 01111abcd |
| 0001000abcdef | 3 | 0000001000abc | 011 | 100000abc |
| 0001001abcdef | 3 | 0000001001abc | 011 | 100001abc |
| 0001010abcdef | 3 | 0000001010abc | 011 | 100010abc |
| 0001011abcdef | 3 | 0000001011abc | 011 | 100011abc |
| 0001100abcdef | 3 | 0000001100abc | 011 | 100100abc |
| 0001101abcdef | 3 | 0000001101abc | 011 | 100101abc |
| 0001110abcdef | 3 | 0000001110abc | 011 | 100110abc |
| 0001111abcdef | 3 | 0000001111abc | 011 | 100111abc |
| 0010000abcdef | 4 | 00000010000ab | 100 | 1010000ab |
| 0010001abcdef | 4 | 00000010001ab | 100 | 1010001ab |
| 0010010abcdef | 4 | 00000010010ab | 100 | 1010010ab |
| 0010011abcdef | 4 | 00000010011ab | 100 | 1010011ab |
| 0010100abcdef | 4 | 00000010100ab | 100 | 1010100ab |
| ... | ... | ... | ... | ... |
| 0110111abcdef | 5 | 0000000110111a | 101 | 11010111a |
| 0111111abcdef | 5 | 0000000111111a | 101 | 11011111a |
| 1000000abcdef | 6 | 00000001000000 | 110 | 111000000 |
| 1010000abcdef | 6 | 00000001010000 | 110 | 111010000 |
| 1111000abcdef | 6 | 00000001111000 | 110 | 111111000 |
| 1111111abcdef | 6 | 00000001111111 | 110 | 111111111 |

In this example, the address vector is shifted to the right according to leading zeros. LBSs (Least Significant Bits) which are shifted out of the register are omitted. Zeros are filled in from the left. Then a number of bits on the left are also omitted. Finally an offset value is added to restore the continuity of the memory. This scheme can also be generalized, as shown in the following table:

|          |                  |            | With 20 Bit Memory |            |
|----------|------------------|------------|--------------------|------------|
| Number n | From $2^n-1$ Bits | To Bits | From Bits | To Bits |
| 2 | 3 | 2 | 21 | 20 |
| 3 | 7 | 3 | 24 | 20 |
| 4 | 15 | 4 | 31 | 20 |
| 5 | 31 | 5 | 46 | 20 |
| 6 | 63 | 6 | 77 | 20 |
| 7 | 127 | 7 | 140 | 20 |

Figure 7:
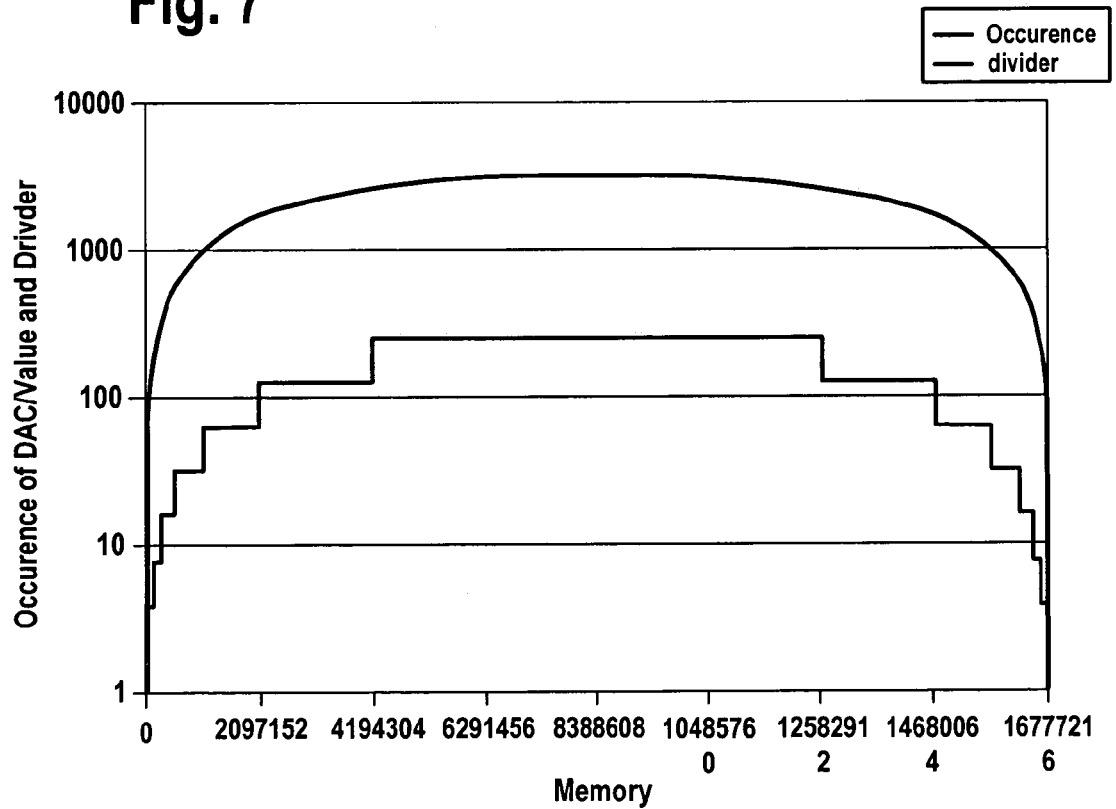
FIG. 7 shows the occurrence of memory entries with a memory having a 24-bit address space.

FIG. 7 shows the number of identical memory entries for a 14 Bit DAC being addressed by a 24 Bit wide memory. A reduction to a 20 Bit, or 19 Bit memory respectively is possible with an error of 1 LSB in the whole range.

In another example, one uses an address word consisting of 32 bits and a compression degree of 5 to address 4.3 GSamples. Assuming a resolution of 14 bits for each amplitude value, one needs a total memory of 4.38 GSamples*14 bits to store all possible amplitude values. As mentioned before, dependent on the amplitude distribution, a lot of level values are similar or even equal.

The address-mapping unit 20 now takes the first 20 most significant bits of the first address space of 4.3 G Samples and maps them onto 7 most significant bits of a 512 k Sample address space according to the table. In an address range wherein the deviation of the amplitude distribution is quite high, the full resolution is used. However, in the address range having the MSB-bits from 0000111 to 1111000 wherein the deviation of the amplitude distribution is quite low, the amplitude values can be condensed and are used for up to 1000000 different addresses. The procedure allows to map a 226 bit (70.4*1012 samples) wide virtual memory within a 512 kSample physical memory. The memory mapping according to this example of the embodiment is dependent on the level distribution to be stored within the memory 30. Due to the memory mapping, it is possible to generate noise signals having a crest factor of 10 or more, resulting in a probability of $10^{-7}$ for peak amplitude values.

The memory 30 further comprises an input terminal 302, which is connected to a programming unit 40. The programming unit 40 is adapted for storing values representing an amplitude distribution within the memory. For example, the programming unit might comprise a hard disk or a different storage device, in which different amplitude distributions are stored. Since the PRWS generator 10 generates a very good random word, it is sufficient to store the values representing the desired noise distribution function within the memory 30. Addressing the different values using the random word generated by the PRWS generator 10 creates a very flexible noise pattern. The digital filter 50 adjusts the spectrum to custom needs. The digital filter 50 is of higher order and some of its filter characteristics are selectable. For example its cut-off frequency is selectable. In addition, the filter comprises a bypass, wherein an input signal is forwarded to the output without filtering. The digital/analog converter 60 and the reconstruction filters 70 optimize the noise provided by the generator.

What is claimed is:

1. A noise signal generator, comprising:
   a random word generator configured for generating a sequence of random words, each word representing an input value,
   a mapping unit configured for receiving the sequence of random words, mapping each input value to an output value according to a probability distribution function, and providing a corresponding sequence of output values, and
   a digital-to-analog converter configured for generating a noise signal based on the output values,
   wherein the mapping unit comprises a first mapping circuit configured to map each input value to an interim value according to a first mapping function, and a second mapping circuit configured to map each interim value to an output value according to a second mapping function.

2. The noise signal generator of claim 1, wherein the mapping unit is realized as a memory that keeps stored for each input value an output value, and that is addressed by the words received from the random word generator.

3. The noise signal generator of claim 1, wherein the random word generator is configured for generating sequences of $2^n$ pseudo random words, wherein the values represented by the words are equally distributed over a range of values.

4. The noise signal generator of claim 3, wherein the random word generator comprises a linear feedback shift register.

5. The noise signal generator of claim 1, further comprising a digital filter connected between the mapping unit and the digital-to-analog converter configured to shape the frequency spectrum of the noise signal.

6. The noise signal generator of claim 1, wherein the first mapping circuit is realized as compression unit configured to map a plurality of such input values to one interim value, where the corresponding output values are equal or the differences of the output values are below a defined threshold, and the second mapping circuit is realized as a memory that keeps stored for each interim value an output value.

7. The noise signal generator of claim 6, wherein the first mapping circuit the input values are mapped to interim values by dividing by a factor and adding an offset value.

8. The noise signal generator of claim 1, wherein the random words of an input space of w bits are mapped to interim words of an interim space of m bits by the first mapping circuit, and the interim words are mapped to output words of an output space of p bits by the second mapping circuit.

9. A method for generating a noise signal comprising:
   generating a sequence of random words, each word representing an input value,
   mapping each input value to an output value of according to a probability distribution function, and providing a corresponding sequence of output values, and
   generating a noise signal based on the mapped values by performing a digital-to-analog conversion,
   wherein the mapping is performed by a mapping memory and the mapping comprises:
      determining an amplitude distribution over the noise signal range of the noise to be generated,
      determining an integral of the amplitude distribution over the noise signal range, and
      storing the integral of the amplitude distribution over the noise signal range into the memory.

10. A software program or product, embodied on a computer readable medium, for controlling the method of claim 9, when run on a data processing system.

* * * * *